United States Patent [19]

Dotson et al.

[11] Patent Number: 4,514,648
[45] Date of Patent: Apr. 30, 1985

[54] CURRENT SENSE CIRCUIT FOR A BUBBLE MEMORY VOLTAGE BOOSTER

[75] Inventors: Robert N. Dotson, Mesa; Robert B. Davies; Ira Miller, both of Tempe, all of Ariz.

[73] Assignee: Motorola, Inc., Schaumburg, Ill.

[21] Appl. No.: 412,057

[22] Filed: Aug. 27, 1982

[51] Int. Cl.³ .................. H03K 5/153; H03K 5/24; H03K 17/08
[52] U.S. Cl. ................. 307/350; 307/296 R; 307/362; 307/300
[58] Field of Search ............ 307/350, 362, 296 R, 307/300

[56] References Cited

U.S. PATENT DOCUMENTS 3,979,606  9/1976  Ahmed ........................... 307/362

Primary Examiner—John Zazworsky
Attorney, Agent, or Firm—Vincent B. Ingrassia

[57] ABSTRACT

In a voltage boost circuit for use in conjunction with a bubble memory operational driver, an output transistor is alternately turned on and off. When turned on, current flows through an inductor. When turned off, a high voltage is built up across the inductor which causes charge to be transferred to and stored in a capacitor. When the output transistor is turned on so as to permit current to flow through the inductor, a $\Delta V_{BE}/R$ current representative of the current flowing through the output transistor is compared with a $\Delta V_{BE}/R$ reference current. When the first current reaches and exceeds the reference current, the output transistor is turned off.

6 Claims, 1 Drawing Figure

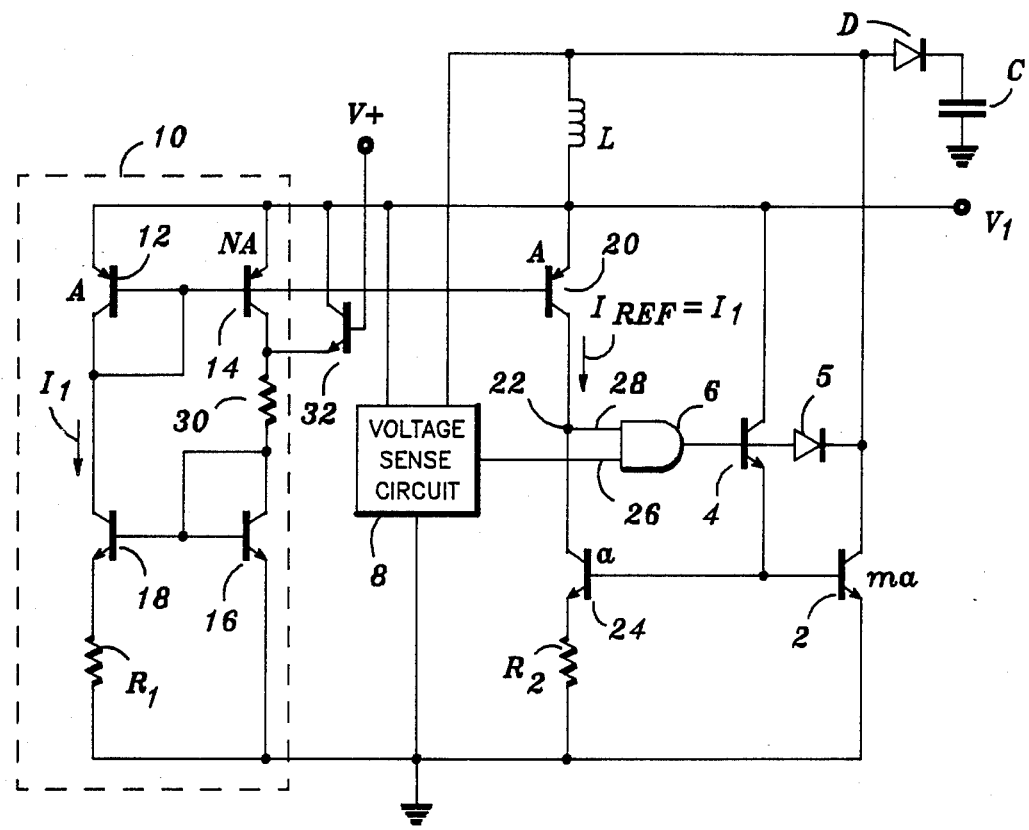

4,514,648

CURRENT SENSE CIRCUIT FOR A BUBBLE MEMORY VOLTAGE BOOSTER

BACKGROUND OF THE INVENTION

This invention relates generally to voltage boost circuits and, more particularly, to a circuit for shutting off an output transistor when the current flowing therethrough exceeds a predetermined value.

The voltage booster of a bubble memory operational driver requires circuitry for sensing when the voltage on an inductor decreases to a value approximately equal to the supply voltage so as to determine the earliest time at which an output pull-down transistor may be turned on which in turn permits current to flow in the inductor. An example of a voltage sense circuit for performing this function is shown and described in copending U.S. Pat. No. 4,461,989 entitled LOW CURRENT VOLTAGE BOOST CIRCUIT filed of even date herewith and assigned to the assignee of the present invention.

At some time after the pull-down transistor has been turned on, the current flowing through the inductor and therefore the current flowing through the pull-down transistor will reach a value at which the pull-down transistor must be turned off to limit the peak current, avoid saturating the pull-down transistor or inductor, and setting the switching frequency to a reasonable value (e.g. 50 kHz) without requiring an external capacitor. Since the current which is being monitored is rather high (e.g. 150 milliamperes) and since it is necessary to get the greatest drop across the inductor with only a relatively small supply voltage (e.g. 5 volts), sensing the voltage drop across a series emitter dropping resistor in order to determine current is not an acceptable technique. Furthermore, the switching point at which the pull-down transistor is turned on depends on the absolute value of the series emitter dropping resistor which may vary with temperature causing the switch point to vary with temperature.

SUMMARY OF THE INVENTION

It is an object of the present invention to provide an improved peak current sense circuit.

It is a further object of the present invention to provide a peak current sense circuit for use on the voltage booster of a bubble memory operational driver which provides a switch point which is not dependent on the absolute value of a resistor and which tracks over temperature.

According to a broad aspect of the invention there is provided a circuit for monitoring a first current flowing through a first transistor, comprising: first means including at least second and third transistors for generating a reference current in the form of $\Delta V_{BE}/R_1$ where $\Delta V_{BE}$ is a difference in base-emitter voltages between said second and third transistors and $R_1$ is the value of a first resistor; and second means coupled to said first transistor and to said first means and including at least a fourth transistor for generating a second current in the form of $\Delta V_{BE}/R_2$ where $\Delta V_{BE}$ is the difference in base-emitter voltages between said fourth transistor and said first transistor and $R_2$ is the value of a second resistor, which second current is representative of said first current.

According to a further aspect of the invention there is provided a voltage boost circuit for generating a high voltage across a capacitor by alternately drawing current through an inductor coupled to said capacitor and terminating said current so as to produce a voltage across said inductor which causes charge to be transferred to and stored in said capacitor, comprising: first and second supply voltage conductors; output transistor means having a collector coupled to said inductor, an emitter coupled to said second supply voltage conductor and having a base; first means coupled to said first and second supply voltage conductors, to said inductor and to said output transistor means for rendering said output transistor means conductive when the voltage across said inductor falls below a first predetermined value so as to cause current to flow through said inductor; first means including at least first and second transistors and a first resistor for generating a reference current in the form of $\Delta V_{BE}/R_1$ where $\Delta V_{BE}$ is the base-emitter voltage differential between said first and second transistors and $R_1$ is the value of said first resistor; second means coupled to said first means and including at least a third transistor and a second resistor for generating a second current in the form of $\Delta V_{BE}/R_2$ where $\Delta V_{BE}$ is a base-emitter voltage differential between said third transistor and said output transistor means and $R_2$ is the value of said second resistor, which second current is representative of current flowing through said output transistor means; and third means coupled to said first and second means and to said output transistor means for supplying base drive to said output transistor means when said second current is less than said first current.

BRIEF DESCRIPTION OF THE DRAWINGS

The above and other objects, features and advantages of the present invention will be more clearly understood from the following detail description taken in conjunction with the accompanying drawing which is a schematic diagram of the inventive current sense apparatus.

DESCRIPTION OF THE PREFERRED EMBODIMENT

Referring to the drawing an inductor L has a first terminal coupled to the $V_1$ supply voltage conductor (typically 5 volts) and a second terminal coupled to a first terminal of capacitor C via rectifier D. The second terminal of capacitor C is coupled to a second lower potential (typically ground). An output NPN transistor 2 has a collector coupled to the second terminal of inductor L, an emitter coupled to ground and a base coupled to the emitter of NPN transistor 4 which in turn has a collector coupled to the $V_1$ voltage supply conductor. The base of transistor 4 is coupled to the output of a drive gate 6 shown in the form of a typical AND gate. A first input 26 of AND gate 6 is coupled to the output of voltage sense circuit 8 having inputs coupled to $V_1$, ground, and the second terminal of inductor L. Voltage sense circuit 8 may be of the type shown and described in the above cited U.S. patent the teachings of which are hereby incorporated by reference.

As described in the above cited U.S. patent, voltage sense circuit 8 monitors the second terminal of inductor L to determine when the voltage thereat has decreased to a value which is approximately equal to the supply voltage ($V_1$) at which time output pull-down transistor 2 may be turned on permitting current to flow through the inductor. As long as the current flowing through output transistor 2 has not exceeded a predetermined value, the second input 28 of drive gate 6 will be enabled. Furthermore, when the voltage at the second terminal of inductor L has fallen to a required value, voltage sense circuit 8 will enable the first input 26 of drive gate 6.

With both inputs of drive gate 6 enabled, an output is provided to drive transistor 4 turning it on and supplying base drive to output transistor 2. This turns output transistor 2 on permitting current to flow through inductor L and output transistor 2. When the current through transistor 2 reaches a predetermined value, output transistor 2 is turned off by placing a disabling signal on the second input 28 of drive gate 6. With output transistor 2 disabled, current stops flowing through transistor 2 causing a large voltage to be built up across inductor L, causes charge to be transferred to and stored in capacitor C, and the voltage at the second terminal of inductor L again falls.

The current through output transistor 2 is sensed as follows. A current latch circuit 10 includes a first diode connected PNP transistor 12 having an emitter coupled to $V_1$, a second PNP transistor 14 having an emitter coupled to $V_1$ and a base coupled to the collector/base of transistor 12, a diode connected NPN transistor 16 having a base/collector coupled to the collector of transistor 14 and having an emitter coupled to ground, a fourth NPN transistor 18 having a collector coupled to the collector/base of transistor 12, a base coupled to the collector/base of transistor 16, and a resistor $R_1$ coupled between the emitter of transistor 18 and ground. Transistors 12 and 14 are emitter ratioed such that transistor 12 has an emitter area A and transistor 14 has an emitter area NA where N is a positive number greater than one. Since the emitters of transistors 12 and 14 are coupled together and the bases of transistors 12 and 14 are coupled together, greater current will flow through transistor 14 increasing the $V_{BE}$ (base-emitter voltage) of transistor 16 over that of transistor 18. Thus a $\Delta V_{BE}$ is established. Current $I_1$ is therefore equal to the difference in base-emitter voltages between transistor 16 and 18 ($\Delta V_{BE}$) divided by the value of resistor $R_1$; (i.e. $\Delta V_{BE}/R_1$). Since the emitter of a current reference transistor 20 is coupled to the emitters of transistors 12 and 14 in current latch 10 and has an emitter area A, and since the base of current reference transistor 20 is coupled to the bases of transistors 12 and 14, a reference current $I_{REF}$ will flow in the collector of transistor 20 which is equal to $I_1$ flowing in the collector of transistor 18. This reference current $I_{REF}$ flows into node 22 which is coupled to the second input 28 of drive gate 6 and to the collector of NPN transistor 24.

As can be seen, transistor 24 has a base coupled to the emitter of drive transistor 4 and is equipped with a series resistor $R_2$ coupled between its emitter and ground. The emitter areas of transistors 2 and 24 are area ratioed such that the emitter area of transistor 24 is "a" while that of transistor 2 is "ma" where "m" is a positive number greater than one. Thus, a $\Delta V_{BE}$ will be established between transistor 2 and 24 resulting in a current flowing in transistor 24 which is equal $\Delta V_{BE}/R_2$. As long as $\Delta V_{BE}/R_2$ is less than $I_{REF}$, the voltage at node 22 will be such as to enable drive gate 6 maintaining drive transistor 4 and output transistor 2 on. However, as the current flowing through output transistor 2 increases, its base-emitter voltage will increase which in turn causes the difference between its base-emitter voltage and that of transistor 24 to increase (i.e. $\Delta V_{BE}$ increases). This will result in an increase in the current flowing into the collector of transistor 24. When this current reaches and exceeds $I_{REF}$, the second input 28 of drive gate 6 will be disabled causing transistor 4 and transistor 2 to turn off. Input 28 of AND gate 6 will again be enabled when the current flowing into the collector of transistor 24 falls below $I_{REF}$, however, due to a built-in delay in gate 6, drive will not be re-applied to transistor 4 and output transistor 2 before input 26 is disabled due to a high voltage on the collector of transistor 2. Transistor 2 will then be turned on again when the voltage at the second terminal of inductor L falls to a predetermined value as described earlier. Diode 5 coupled between the base of transistor 4 and the collector of transistor 2 prevents the output transistor from becoming saturated.

It should be noted that if both $R_1$ and $R_2$ are manufactured from the same resistive material on an integrated circuit, then errors in their absolute values will track each other if they are located reasonably close together on the die. Furthermore, changes in $R_1$ and $R_2$ will track over temperature. In addition, the base-emitter voltage differentials between transistors 16 and 18 and transistors 2 and 24 will have the same temperature coefficient and will also track over temperature. The result is a switching threshold level at node 22 which is not dependent on the absolute values of the resistors and one which tracks over temperature.

To assure that the circuit does not hang up in a stable off condition, an NPN transistor 32 is provided which has a collector coupled to $V_1$, a base coupled to $V+$ (e.g. 2.5 volts), and an emitter coupled to the collector/base of transistor 16 via resistor 30.

The above description is given by way of example only. Changes in form and details may be made by one skilled in the art without departing from the scope of the invention.

We claim:

1. A circuit for monitoring a first current flowing through a first transistor, comprising:

first means including at least second and third transistors for generating a reference current in the form of $\Delta V_{BE}/R_1$ wherein $\Delta V_{BE}$ is a difference in base-emitter voltages between said second and third transistor and $R_1$ is the value of a first resistor coupled to the emitter of said third transistor; and second means coupled to said first transistor and to said first means and including at least a fourth transistor for generating a second current in the form of $\Delta V_{BE}/R_2$ where $\Delta V_{BE}$ is the difference in base-emitter voltages between said fourth transistor and said first transistor and $R_2$ is the value of a second resistor coupled to the emitter of said fourth transistor, which second current is representative of said first current.

2. A circuit according to claim 1 further including third means coupled to said first and second means for supplying base drive to said first transistor when said second current is less than said reference current first transistor has an emitter area "ma" where "m" is a positive number greater than 1.

3. The circuit according to claim 2 further comprising a first supply voltage conductor coupled to said first and second means and a second supply voltage conductor and wherein said fourth transistor has a collector coupled to an output of said first means and to an input of said third means, a base coupled to the output of said third means and to the base of said first transistor and wherein said second resistor is coupled between the emitter of said fourth transistor and said second supply voltage conductor.

4. A circuit according to claim 3 wherein said fourth transisitor has an emitter area "a" and wherein said 5. The circuit according to claim 3 wherein said second transistor has an emitter coupled to said second supply voltage conductor and has a base coupled to its collector, said third transistor has an emitter coupled to said second supply voltage conductor via said first resistor, a base coupled to the base/collector of said second transistor and has a collector, and wherein said first means further comprises:

a fifth transistor having a base and collector coupled to the collector of said third transistor and having an emitter coupled to said first supply voltage conductor; and a sixth transistor having a collector coupled to the collector/base of said second transistor, a base coupled to the base/collector of said fifth transistor and having an emitter coupled to said first supply voltage conductor.

6. A circuit according to claim 5 wherein siad fifth transistor has an emitter area A and wherein said sixth transistor has an emitter area NA where N is a positive number greater than 1.

* * * * *

UNITED STATES PATENT AND TRADEMARK OFFICE
CERTIFICATE OF CORRECTION

PATENT NO. : 4,514,648
DATED : April 30, 1985
INVENTOR(S) : Dotson et al.

It is certified that error appears in the above-identified patent and that said Letters Patent is hereby corrected as shown below:

Column 4, claim 2, beginning at the end of line 58 through line 60, delete "first transistor has an emitter area "ma" where "m" is a positive number greater than 1".

Column 5, claim 4, line 5; after "said" insert --first transistor has an emitter area "ma" where "m" is a positive number greater than 1.--.

Column 6, claim 6, line 10; change "siad" to --said--.

Signed and Sealed this

Third Day of December 1985

[SEAL]

Attest:

DONALD J. QUIGG

Attesting Officer      Commissioner of Patents and Trademarks